(12) United States Patent
Son et al.

(10) Patent No.: US 10,401,991 B2
(45) Date of Patent: Sep. 3, 2019

(54) DISPLAY DEVICE AND METHOD FOR MANUFACTURING SAME

(71) Applicant: Samsung Display Co., Ltd., Yongin-si (KR)

(72) Inventors: Jungha Son, Seoul (KR); Jaeneung Kim, Seoul (KR); Yong-hwan Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 15/457,044

(22) Filed: Mar. 13, 2017

(65) Prior Publication Data

US 2017/0269724 A1 Sep. 21, 2017

(30) Foreign Application Priority Data

Mar. 17, 2016 (KR) ........................ 10-2016-0032311

(51) Int. Cl.
| | |
|---|---|
| *G06F 3/041* | (2006.01) |
| *H01L 27/32* | (2006.01) |
| *H01L 51/52* | (2006.01) |
| *H01L 51/00* | (2006.01) |
| *G06F 3/044* | (2006.01) |

(52) U.S. Cl.
CPC .............. *G06F 3/041* (2013.01); *G06F 3/044* (2013.01); *H01L 27/323* (2013.01); *H01L 27/3244* (2013.01); *H01L 51/0097* (2013.01); *H01L 51/52* (2013.01); *G06F 2203/04102* (2013.01); *G06F 2203/04103* (2013.01); *H01L 2227/323* (2013.01); *H01L 2251/5338* (2013.01); *Y02E 10/549* (2013.01); *Y02P 70/521* (2015.11)

(58) Field of Classification Search
CPC .............. G09G 3/3208; G09G 2380/02; G06F 1/1652; G06F 3/0412
USPC ................................ 345/156, 690; 359/743
See application file for complete search history.

(56) References Cited

U.S. PATENT DOCUMENTS

| 9,430,072 B2 | 8/2016 | Lin et al. |
|---|---|---|
| 2013/0300678 A1 | 11/2013 | Kang et al. |
| 2015/0153873 A1 | 6/2015 | Lee et al. |

(Continued)

FOREIGN PATENT DOCUMENTS

| JP | 2016-224439 | 12/2016 |
|---|---|---|
| KR | 10-2013-0126007 | 11/2013 |

(Continued)

OTHER PUBLICATIONS

Yongming Sun et al., A Bamboo-Inspired Nanostructure Design for Flexible, Foldable, and Twistable Energy Storage Devices, ACS Publications, May 26, 2015, pp. 3899-3906.

*Primary Examiner* — Calvin C Ma
(74) *Attorney, Agent, or Firm* — H.C. Park & Associates, PLC

(57) ABSTRACT

A display device including a display panel configured to display an image and having a folding area by which the display panel is configured to be folded along a folding axis, and a touch member disposed on the display panel and configured to detect an external touch signal. The touch member includes a plurality of first conductive patterns disposed to overlap the folding area, in which each of the first conductive patterns includes a fiber layer including a plurality of nanofibers, and the nanofibers includes a plurality of cavities.

20 Claims, 18 Drawing Sheets

(56) References Cited

U.S. PATENT DOCUMENTS

| | | | |
|---|---|---|---|
| 2016/0118605 A1* | 4/2016 | Kawakami | H01L 51/0025 257/40 |
| 2016/0202476 A1* | 7/2016 | Chong | G02B 27/0068 359/743 |
| 2017/0017318 A1 | 1/2017 | Son et al. | |
| 2017/0052619 A1 | 2/2017 | Park et al. | |
| 2017/0242515 A1 | 8/2017 | Son et al. | |

FOREIGN PATENT DOCUMENTS

| | | |
|---|---|---|
| KR | 10-2015-0063871 | 6/2015 |
| KR | 10-2017-0010181 | 1/2017 |
| KR | 10-2017-0023311 | 3/2017 |
| KR | 10-2017-0098382 | 8/2017 |

\* cited by examiner

DISPLAY DEVICE AND METHOD FOR MANUFACTURING SAME

CROSS-REFERENCE TO RELATED APPLICATION

This application claims priority from and the benefit of Korean Patent Application No. 10-2016-0032311, filed on Mar. 17, 2016, which is hereby incorporated by reference for all purposes as if fully set forth herein.

BACKGROUND

Field

Exemplary embodiments relate to a display device and a method for manufacturing the same, and more particularly, to a display device having enhanced folding properties and a method for manufacturing the same.

Discussion of the Background

Display devices may display various images on a display and provide information to users. Recently, foldable display devices equipped with flexible display members are being developed, which may include a touch member in the display device. Accordingly, the touch member may be folded in correspondence with the display member.

The touch member may input data by obtaining a coordinate data of a position at which a touch event has occurred. The display member is generally connected with the touch member and may display an image corresponding to the data input from the touch member.

Unlike flat display devices, foldable display devices may be folded, rolled, or curved like a paper. Foldable display devices, the shapes of which can be variously modified, may be portable and enhance user convenience.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device with enhanced reliability, while maintaining the touch sensitivity, and a method for manufacturing the same.

According to an exemplary embodiment, a display device includes a display panel configured to display an image and having a folding area by which the display panel is configured to be folded along a folding axis, and a touch member disposed on the display panel and configured to detect an external touch signal, the touch member including a plurality of first conductive patterns disposed to overlap the folding area, in which each of the first conductive patterns includes a fiber layer including a plurality of nanofibers, and the nanofibers includes a plurality of cavities.

Each of the first conductive patterns may further include a first conductive layer disposed on the display panel, and a second conductive layer disposed on the first conductive layer, in which the fiber layer is disposed between the first conductive layer and the second conductive layer.

A planar width of the second conductive layer may be greater than a planar width of the fiber layer, and the second conductive layer may cover the fiber layer and side surfaces of the first conductive layer.

Each of the first conductive patterns may further include a partition surrounding side surfaces of the first conductive layer and the fiber layer.

A planar width of the second conductive layer may be greater than a planar width of the fiber layer, and the second conductive layer may cover the fiber layer and outer side surfaces of the partition.

The partition may include at least one of silicon oxide, silicon nitride, and silicon oxynitride.

The touch member may further include a plurality of second conductive patterns disposed to overlap a non-folding area adjacent to the folding area, each of the second conductive patterns may include a third conductive layer; and a cross-sectional shape of each of the second conductive patterns may be different from a cross-sectional shape of each of the first conductive patterns.

The fiber layer may further include a filler including a polymer material charged between the nanofibers.

The nanofibers may include an organic material.

The nanofibers may include a carbon nanotube.

According to an exemplary embodiment, a display device includes a display panel configured to display an image and having a folding area by which the display panel is configured to be folded along a folding axis, and a touch member disposed on the display panel and configured to detect an external touch signal, the touch member including a plurality of conductive patterns disposed to overlap the folding area. Each of the conductive patterns includes a first conductive layer disposed on the display panel, a second conductive layer disposed on the first conductive layer, a fiber layer disposed between the first conductive layer and the second conductive layer and including a plurality of nanofibers, and a partition surrounding side surfaces of the first conductive layer and the fiber layer.

Each of the nanofibers may include a plurality of cavities.

A planar width of the second conductive layer may be greater than a planar width of the fiber layer, and the second conductive layer may cover outer side surfaces of the partition and the fiber layer.

The partition may include at least one of silicon oxide, silicon nitride, and silicon oxynitride.

According to an exemplary embodiment, a method for manufacturing a display device includes forming a first conductive pattern on a folding area of a display panel, by which the display panel is configured to be folded along a folding axis. Forming the first conductive pattern includes forming a first conductive layer, forming a fiber layer including a plurality of nanofibers on the first conductive layer, and forming a second conductive layer on the fiber layer.

Forming the fiber layer may include forming the nanofibers including nanoparticles by an electrospinning method, forming a plurality of cavities in each of the nanofibers by etching the nanoparticles in the nanofibers, and charging a filler between the nanofibers.

A planar width of the second conductive layer may be formed to be greater than a planar width of the fiber layer.

Forming the first conductive pattern may include forming a partition surrounding side surfaces of the first conductive layer and the fiber layer.

Forming the first conductive layer may include forming a preliminary conductive layer on a base member, forming a mask pattern on the preliminary conductive layer, and patterning the preliminary conductive layer, such that the preliminary conductive layer corresponds to the mask pattern by etching the preliminary conductive layer. Forming the first conductive pattern may further include forming the partition surrounding the side surfaces of the first conductive layer and the side surfaces of the mask pattern, removing the mask pattern, and forming the fiber layer in a first space formed by the partition and a top surface of the first conductive layer.

Forming the first conductive pattern may further include removing the partition.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
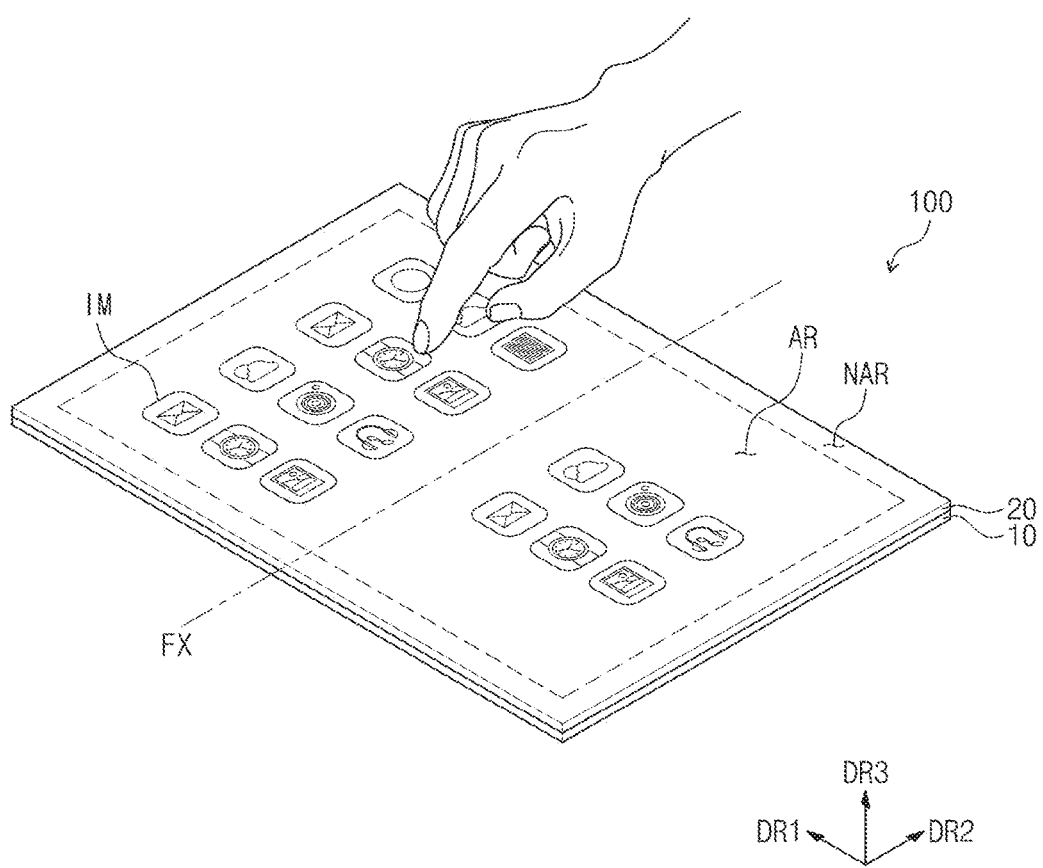
FIG. 1 is a perspective view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
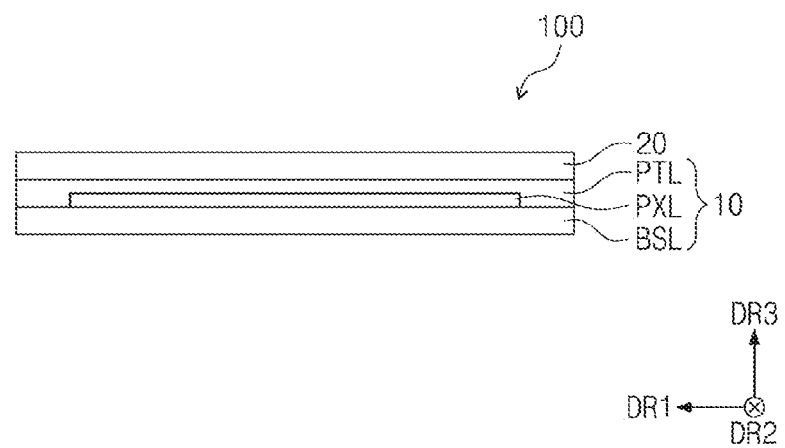
FIG. 2 is a cross-sectional view schematically illustrating the display device illustrated in FIG. 1.

FIG. 1 is a perspective view illustrating a display device according to an exemplary embodiment, and FIG. 2 is a cross-sectional view schematically illustrating the display device of FIG. 1.

Referring to FIGS. 1 and 2, a display device 100 may be divided into an active area AR and a surrounding area NAR in a plane defined by a first direction DR1 and a second direction DR2. The active area AR is defined in a central region of the display device 100 in a plan view. The surrounding area NAR is adjacent to the active area AR, and may surround the active area AR. The surrounding area NAR may have a frame shape surrounding the active area AR.

The display device 100 includes a base member 10 and a touch member 20. The base member 10 may be a base layer on which the touch member 20 is disposed. For example, the base member 10 may be a single insulating substrate or a single insulating film. A display panel displays images on the active area AR.

The base member 10 includes a base layer BSL, a pixel layer PXL, and a protective layer PTL. The base layer BSL may define the rear face of the display device 100 and include a flexible material. The pixel layer PXL is disposed on the base layer BSL. The pixel layer PXL includes pixels, which may generate an image IM by receiving an electrical signal.

According to an exemplary embodiment, the type of the base member 10 may be determined according to the configuration of the pixel layer PXL. The base member 10 may be one of various display panels capable of displaying images, such as a liquid crystal panel, an organic light emitting display panel, an electrophoretic display panel, or an electrowetting display panel. However, a configuration of the base member 10 may be varied.

Figure 3:
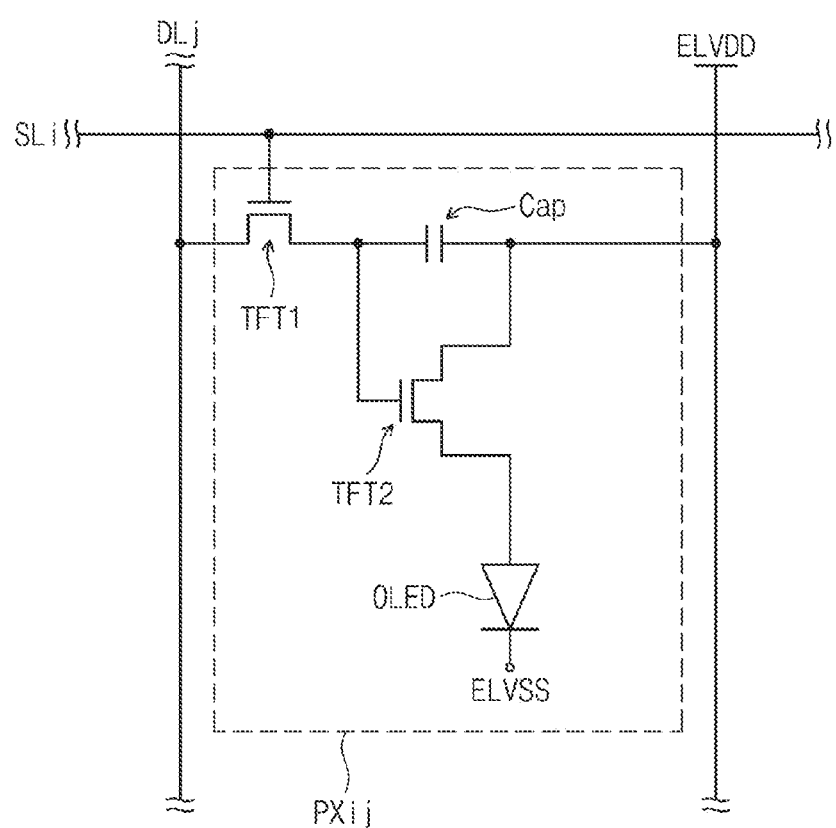
FIG. 3 is an equivalent circuit diagram illustrating a pixel in a display device according to an exemplary embodiment.

FIG. 3 is an equivalent circuit diagram illustrating a pixel in a display device according to an exemplary embodiment.

Referring to FIG. 3, the base member 10 according to an exemplary embodiment may be an organic light emitting display panel. Accordingly, a pixel PXij includes at least one of a thin-film transistor, at least one capacitor, and at least one display element. In FIG. 3, the pixel PXij includes a first thin-film transistor TFT1, a second thin-film transistor TFT2, a capacitor Cap, and an organic light emitting element OLED.

The first thin-film transistor TFT1 includes a control electrode connected to an $i^{th}$ scan line SLi, an input electrode connected to a $j^{th}$ data line DLj, and an output electrode. In response to a scan signal applied to the $i^{th}$ scan line SLi, the first thin-film transistor TFT1 may output a data signal applied to the $j^{th}$ data line DLj.

The capacitor Cap includes a first capacitor electrode connected to the first thin-film transistor TFT1 and a second capacitor electrode, which receives a first power source voltage ELVDD. The capacitor Cap may charge a charge quantity corresponding to the difference between a voltage corresponding to the data signal received from the first thin-film transistor and the first power source voltage ELVDD.

The second thin-film transistor TFT2 includes a control electrode connected to the output electrode of the first thin-film transistor TFT1 and the first capacitor electrode of the capacitor Cap, an input electrode receiving the first power source voltage ELVDD, and an output electrode. The output electrode of second thin-film transistor TFT2 is connected to the organic light emitting element OLED.

The second thin-film transistor TFT2 controls the driving current flowing in the organic light emitting element OLED according to the charge quantity stored in the capacitor Cap. The turn-on time of the second thin-film transistor TFT2 may be determined by the charge quantity charged in the capacitor Cap. The output electrode of the second thin-film transistor TFT2 may supply a voltage lower than the first power source voltage ELVDD to the organic light emitting element OLED.

The organic light emitting element OLED includes a first electrode connected to the second thin-film transistor TFT2 and a second electrode receiving a second power source voltage ELVSS. The organic light emitting element OLED may include a light emitting pattern disposed between the first electrode and the second electrode.

The organic light emitting element OLED emits light during a turn-on interval of the second thin-film transistor TFT2. The color of the light generated from the organic light emitting element OLED may be determined by the material of the light emitting pattern. For example, the color of light generated from the organic light emitting element OLED may be one of red, green, blue, or white.

Referring back to FIG. 2, the protective layer PTL is disposed on the pixel layer PXL and covers the pixel layer PXL. The protective layer PTL electrically insulates the pixel layer PXL from the touch member 20. For example, the protective layer PTL may be an encapsulation layer encapsulating the pixel layer PXL. The protective layer PTL may include laminated organic films and/or inorganic films.

Moreover, the protective layer PTL may be an encapsulation substrate encapsulating the pixel layer PXL. For example, the protective layer PTL may be a glass substrate or a plastic substrate. Furthermore, the protective layer PTL may be a flattening layer which planarizes the top face of the pixel layer PXL. However, the protective layer PTL may be provided in various forms, and is not limited to above.

The touch member 20 is disposed on the protective layer PTL. The active area AR in the touch member 20 may substantially overlap the region in which the pixel layer PXL is disposed. The touch member 20 may detect an external touch signal provided to the active area AR of the display device 100.

The touch signal may be provided using various methods. FIG. 1 illustrates detecting touch signals input through parts of the body of the user, such as a finger. However, the method of providing a touch signal to the touch member 20 is not limited to any particular method. For example, the touch signal may be input using an optical, contact-based, or magnetic methods.

The touch member 20 may include a touch cell, driving lines, and pads (not shown). The touch electrodes may detect external touch signals, and the driving lines may apply an electrical signal to the touch cells or transfer the electrical signals generated in the touch cells to the outside. The pads may be connected with the base member 10 or connected with an external power supply apparatus.

The touch member 20 may detect the touch signal using various methods. For example, the touch member 20 may be operated using a capacitive method, a resistive film method, or a coordinate recognition method.

Figure 4:
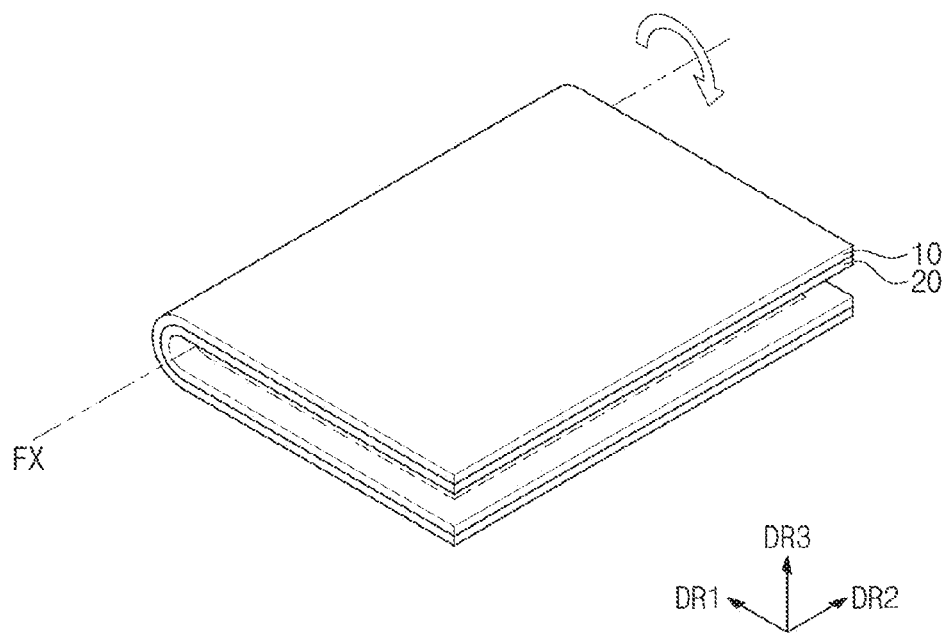
FIG. 4 illustrates the display device illustrated in FIG. 1 in an in-folded state.
Figure 5:
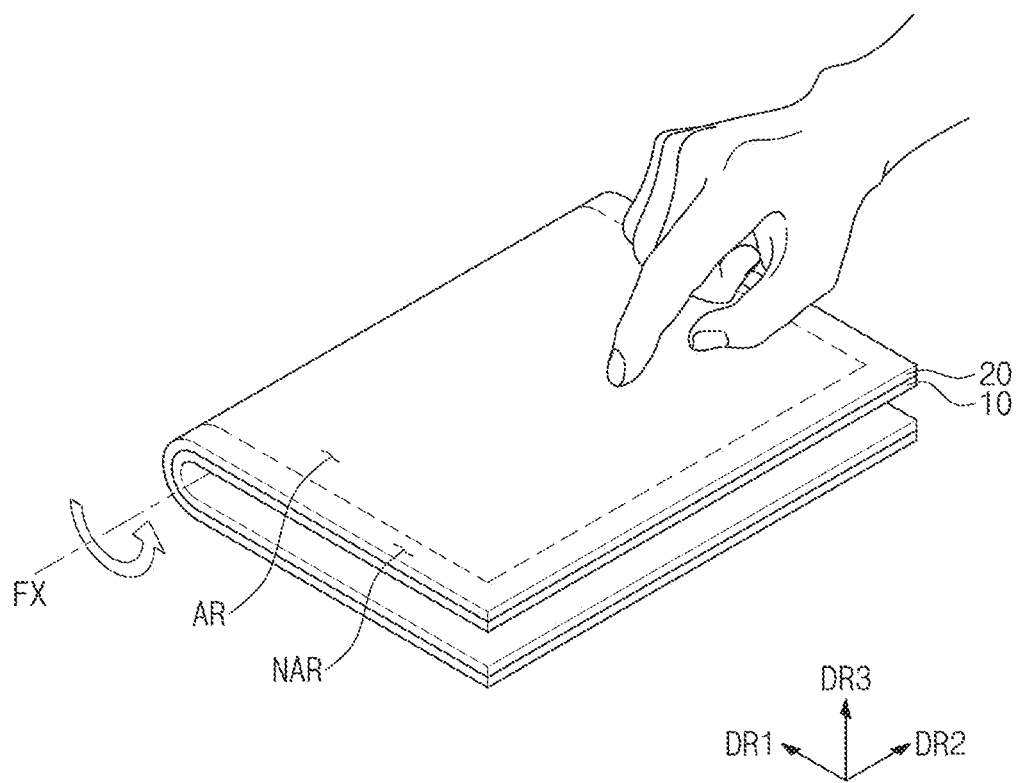
FIG. 5 illustrates the display device illustrated in FIG. 1 in an out-folded state.

FIG. 4 illustrates the display device of FIG. 1 in an in-folded state, and FIG. 5 illustrates the display device of FIG. 1 in an out-folded state.

The display device 100 according to an exemplary embodiment may be folded or unfolded along a folding axis FX extending in a predetermined direction. That is, the display device 100 may be a foldable display device 100. In an exemplary embodiment, the folding axis FX extends in the second direction DR2.

As illustrated in FIG. 4, the display device 100 may be in-folded along the folding axis FX. In this manner, the active area AR is not exposed to the outside. The touch member 20 is covered by the base member 10, and thus, may be protected from the outside.

As illustrated in FIG. 5, the display device 100 may be out-folded along the folding axis FX. In this manner, since the active area AR is externally exposed, external touch signals may be detected even when the display device 100 is in its folded state.

Figure 6:
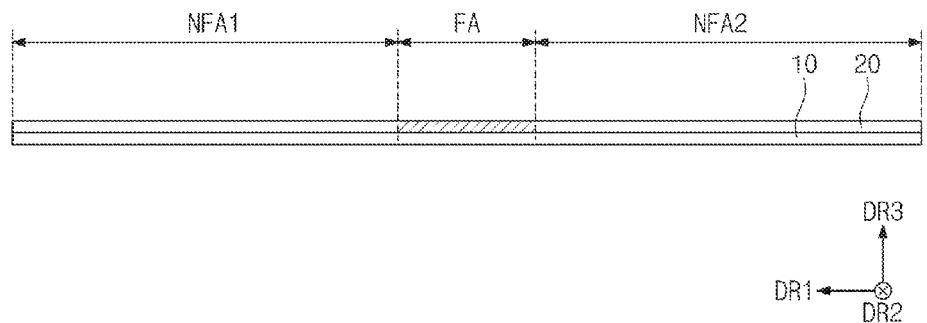
FIG. 6 is a cross-sectional view of a display device in an unfolded state.
Figure 7:
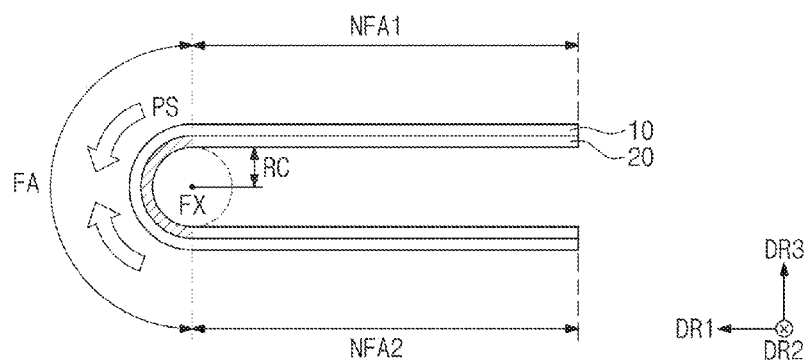
FIG. 7 is a cross-sectional view of the display device illustrated in FIG. 2.
Figure 8:
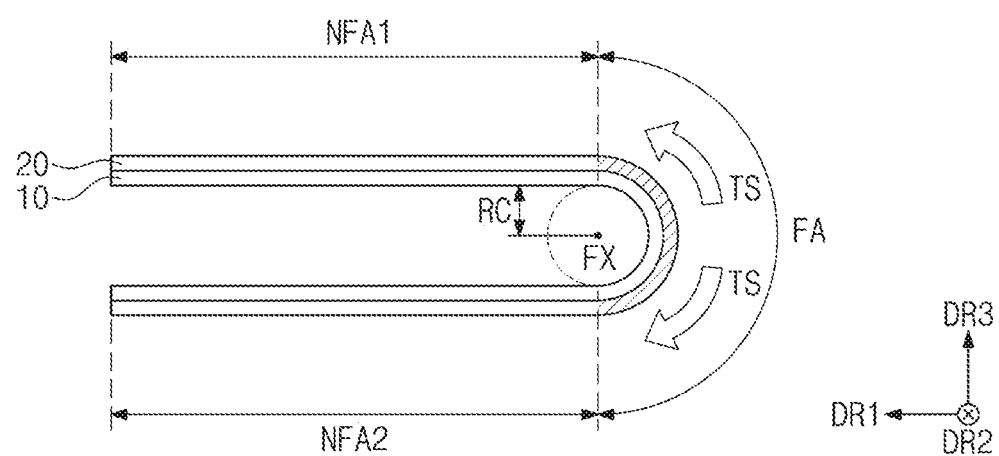
FIG. 8 is a cross-sectional view of the display device illustrated in FIG. 3.

FIGS. 6 to 8 are cross-sectional views of the display device according to an exemplary embodiment. FIG. 6 is a cross-sectional view of the display device in an unfolded state, FIG. 7 is a cross-sectional view of the display device of FIG. 4, and FIG. 8 is a cross-sectional view of the display device in FIG. 5.

Referring to FIG. 6, the display device 100 may be divided into multiple areas according to the folding. Specifically, the display device 100 may be divided into a first non-folding area NFA1, a folding area FA, and a second non-folding area NFA2. In FIG. 6, a portion of the touch member 20 overlapping the folding area FA is indicated with dashed lines for ease of description.

Referring to FIGS. 7 and 8, the folding area FA may be an area subject to stress caused by the folding. The folding area FA overlaps the folding axis FX. As such, when the display device 100 is folded along the folding axis FX to have a predetermined radius of curvature RC, the folding stress may be applied in various forms depending on the folding method. For example, as illustrated in FIG. 7, when the display device 100 is in-folded, a folding stress in the type of compressive stress PS may be applied to the folding area FA of the touch member 20.

The touch member 20 disposed inwardly relative to the base member 10 is disposed closer to the folding axis FX. Accordingly, the folding area FA in the touch member 20 may be more easily deformed by the compressive stress PS. More particularly, the portion corresponding to the folding area FA of the touch member 20 may be contracted and deformed by the compressive stress PS.

Moreover, as illustrated in FIG. 8, when the display device 100 is out-folded, the folding stress in the type of tensile stress TS may be applied to the folding area FA. In this case, the touch member 20 disposed outwardly relative to the base member 10 is disposed farther away from the folding axis FX. Accordingly, the touch member 20 may be more easily deformed by the tensile stress TS. As such, the portion corresponding to the folding area FA of the touch member 20 may be expanded and deformed by the tensile stress TS.

FIGS. 7 and 8 illustrate that a single folding area is defined in the display device 100. However, according to an exemplary embodiment, a plurality of folding areas may be alternatively defined in the display device 100.

Figure 9:
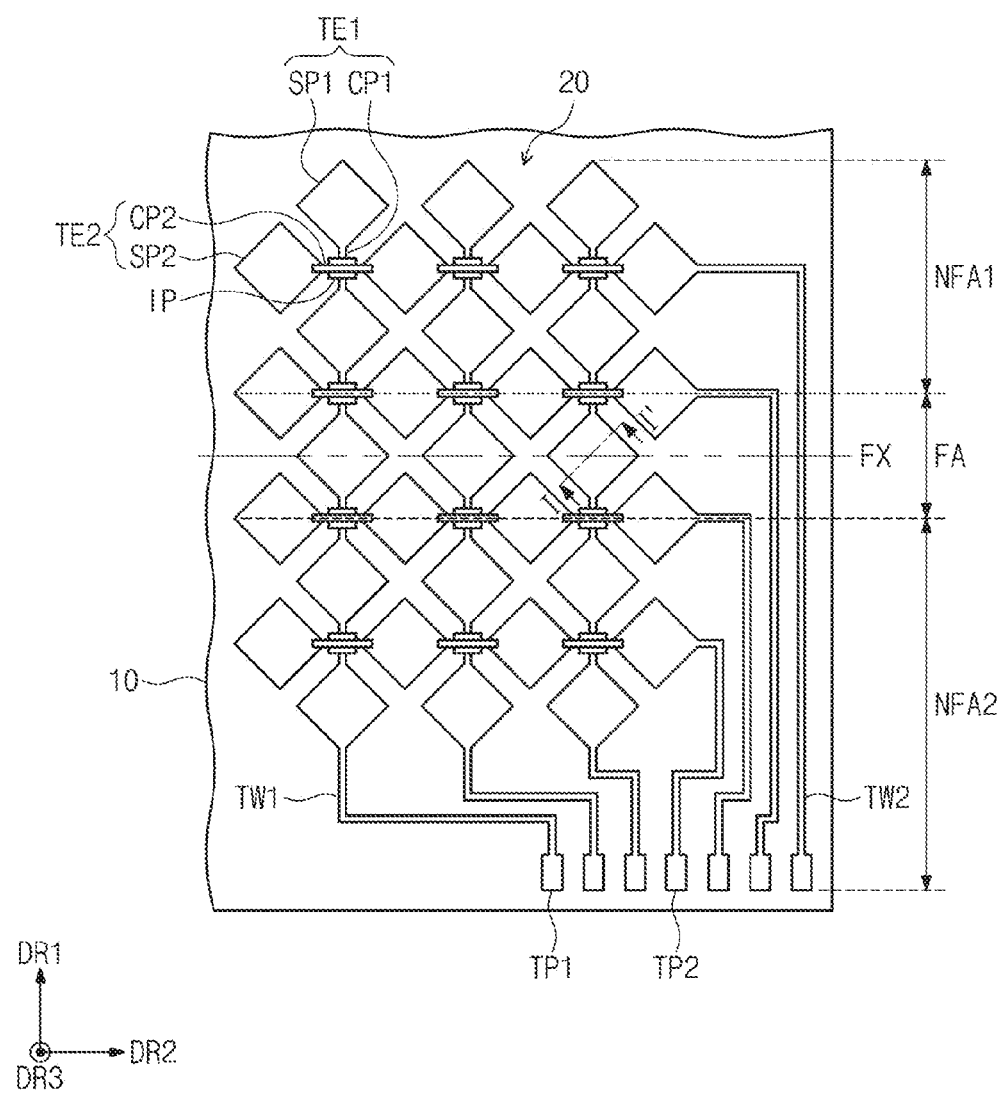
FIG. 9 is a plan view illustrating a display device according to an exemplary embodiment.

FIG. 9 is a plan view illustrating a display device according to an exemplary embodiment.

Referring to FIG. 9, the touch member 20 is disposed on the base member 10. The touch member 20 includes conductive patterns. Each of the conductive patterns may include a first touch electrode TE1, a second touch electrode TE2, a first driving line TW1, a second driving line TW2, a first pad TP1, and a second pad TP2. Each of the conductive patterns may also include various driving elements and lines in addition to the above.

Although not shown, the first touch electrode TE1 and the second touch electrode TE2 are disposed in the active area AR (see FIG. 1). The first touch electrode TE1 and the second touch electrode TE2 may detect the touch signal provided to the active area AR.

The first touch electrode TE1 may be arranged along the first direction DR1. The first touch electrode TE1 includes first sensing patterns SP1 and first connecting patterns CP1. The first sensing patterns SP1 may be arranged along the first direction DR1 and have a rhombus shape. However, the shape of the first sensing patterns SP1 may be varied. Each of the first connecting patterns CP1 may be arranged along the first direction DR1 and disposed between two adjacent first sensing patterns SP1. The first sensing patterns SP1 may be electrically connected to each other by the first connecting patterns CP1.

The second touch electrode TE2 may be arranged along the second direction DR2. The second touch electrode TE2 may have substantially the same shape as the first touch electrode TE1. For example, the second touch electrode TE2 includes second sensing patterns SP2 and second connecting patterns CP2. The second sensing patterns SP2 are arranged along the second direction DR2. The second connecting patterns CP2 area arranged along the second direction DR2 and disposed between two adjacent second sensing patterns SP2. The second sensing patterns SP2 may be electrically connected to each other by the second connecting patterns CP2.

The first sensing patterns SP1 of the first touch electrodes TE1 and the second sensing patterns SP2 of the second touch electrodes TE2 may be disposed on the same layer. In an exemplary embodiment, the first sensing patterns SP1 of the first touch electrode TE1, the second sensing patterns SP2 of the second touch electrode TE2, and the first connecting patterns CP1 of the first touch electrode TE1 may each be disposed on the same layer.

The touch member 20 may further include insulating patterns IP disposed between the first connecting patterns CP1 of the first touch electrode TE1 and the second connecting patterns CP2 of the second touch electrode TE2. The second connecting patterns CP2 and the first connecting patterns CP1 intersect each other while being insulated by the insulating patterns IP.

The first pad TP1 and the second pad TP2 are disposed in the surrounding area NAR (see FIG. 1). The first pad TP1 and the second pad TP2 may be disposed on at least one edge of the touch member 20. The first pad TP1 and the second pad TP2 may be a passageway for electrically connecting the touch member 20 to the outside. The touch member 20 may receive an electrical signal through the first pad TP1 and the second pad TP2, or provide an electrical signal to the outside through the first pad TP1 and the second pad TP2.

The first driving line TW1 and the second driving line TW2 are disposed in the surrounding area NAR (see FIG. 1). The first driving line TW1 connects the first touch electrode TE1 to the first pad TP1, and the second driving line TW2 connects the second touch electrode TE2 to the second pad TP2.

The conductive patterns may be variously disposed in the folding area FA, the first non-folding area NFA1, and the second non-folding area NFA2. In FIG. 9, the first and second touch electrodes TE1 and TE2 and the second driving line TW2 are illustrated as being disposed to overlap the folding area FA. However, according to exemplary embodiments, depending on the arrangement of the conductive patterns, the first driving line TW1, the first pad TP1, and the second pad TP2 may each overlap the folding area FA.

Figure 10:
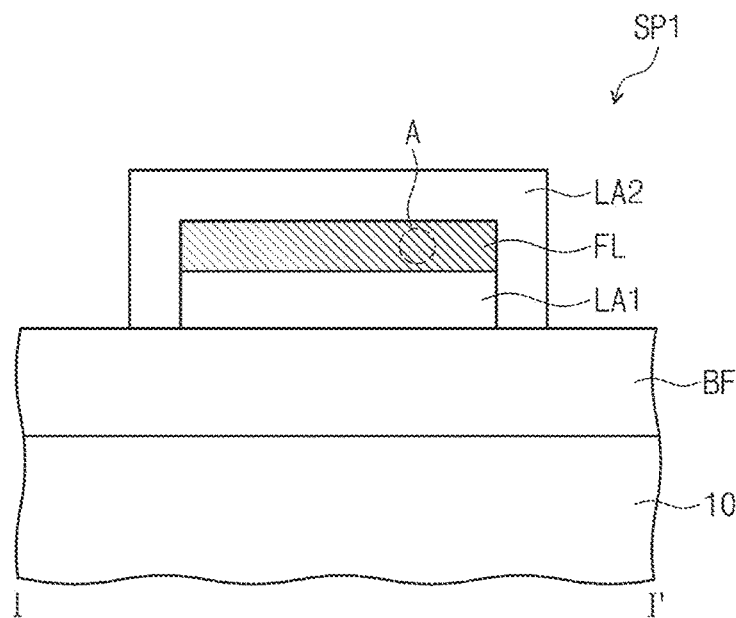
FIG. 10 is a cross-sectional view along line I-I' of the display device of FIG. 9.
Figure 11:
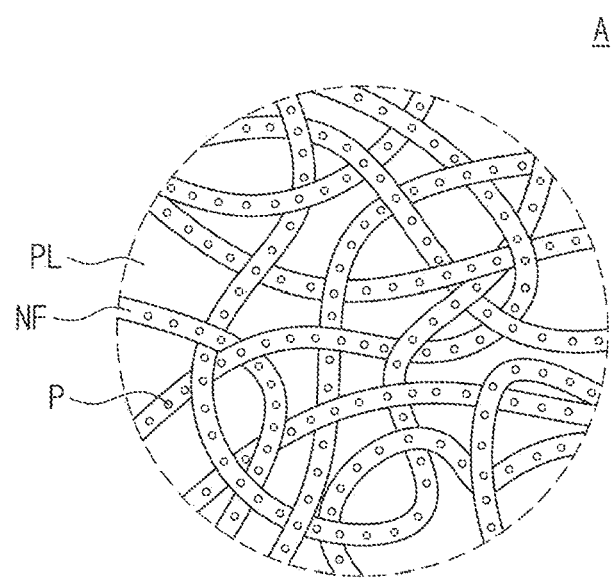
FIG. 11 is an expanded view of area A of FIG. 10.

FIG. 10 is a cross-sectional view along line I-I' of the display device in FIG. 9. FIG. 11 is an expanded view of area A in FIG. 10.

Referring to FIGS. 10 and 11, the first sensing pattern SP1 is disposed on the base member 10. In an exemplary embodiment, the first sensing pattern SP1 may be a first conductive pattern SP1-FA, which will be described later with reference to FIGS. 13 and 14.

A buffer layer BF may be disposed on the base member 10, and the first sensing pattern SP1 may be disposed on the buffer layer BF. The buffer layer BF may include an inorganic insulating material including silicon (Si). The adhesiveness between the first sensing pattern SP1 and the base member 10 may be enhanced by the buffer layer BF. For example, the buffer layer BF may include silicon nitride ($SiN_x$), silicon oxide ($SiO_x$), or silicon oxynitride (SiON) and the like. In an exemplary embodiment, the buffer layer BF may be omitted.

The first sensing pattern SP1 includes a first conductive layer LA1, a fiber layer FL, and a second conductive layer LA2. The first conductive layer LA1 is disposed at the lower portion of the first sensing pattern SP1. For example, the first conductive layer LA1 may be disposed on the buffer layer BF. The first conductive layer LA1 may include an electrically conductive material.

The fiber layer FL is disposed on the first conductive layer LA1. The fiber layer FL overlaps with the first conductive layer LA1 in a plan view. As such, the fiber layer FL may have the same shape as the first conductive layer LA1 in plan view. The fiber layer FL may include nanofibers NF and a filler PL.

In an exemplary embodiment, the nanofibers NF may include an organic material, such as carbon (C). For example, the nanofibers NF may include carbon nanotubes (CNT). However, materials of the nanofiber NF may not be limited thereto, and the nanofibers NF may alternatively include an inorganic material, such as silica ($SiO_2$), alumina ($Al_2O_3$), zirconia ($ZrO_2$), and zinc oxide (ZnO).

The nanofibers NF may be disposed inside the filler PL. More particularly, the filler PL may be disposed to cover the nanofibers NF. The nanofibers NF may be fixed in the filler PL. The filler PL may include a polymer material. For example, the filler PL may include at least one of polyethylene terephthalate (PET), polymethyl methacrylate (PMMA), polycarbonate (PC), triacetate cellulose (TAC), or cyclo olefin polymer (COP).

According to an exemplary embodiment, cavities P may be formed in each of the nanofibers NF. The cavities P may be dispersed in each of the nanofibers NF. The cavities P may be formed through an etching process. The cavities P may more effectively relieve the folding stress applied to the conductive pattern.

The second conductive layer LA2 including an electrically conductive material is disposed on the fiber layer FL. The second conductive layer LA2 overlaps with the fiber layer FL and the first conductive layer LA1 in a plan view. The second conductive layer LA2 may cover the fiber layer FL. More particularly, the planar width of the second conductive layer LA2 may be greater than the planar width of the fiber layer FL. Accordingly, the second conductive layer LA2 may surround side faces of the fiber layer FL and side faces of the first conductive layer LA1.

The configuration of the second sensing pattern SP2 in the second touch electrode TE2 may be substantially similar to the configuration of the first sensing pattern SP1. Thus, repeated description of the substantially similar configuration of the second sensing pattern SP2 will be omitted.

When a touch member having first and second sensing patterns does not include a fiber layer therebetween, the touch member may be damaged by the folding stress applied to its folding area. However, according to an exemplary embodiment, each of the first and second sensing patterns CP1 and CP2 disposed on the folding area FA include the fiber layer FL having a greater flexibility than the first conductive layer LA1 and/or the second conductive layer LA2, which may reduce the folding stress applied to the folding area FA. As such, the display device 100 according to an exemplary embodiment may be strengthened against folding, and thus, have enhanced reliability.

Moreover, according to an exemplary embodiment, the formation of the cavities P in each of the nanofibers NF disposed in the fiber layer FL may provide increased flexibility in the fiber layer FL, as compared to the nanofibers NF without the cavities P. Thus, the folding stress applied to the folding area FA may be more effectively reduced.

FIGS. 12A to 12D each illustrates a cross-sectional view of a display device according to exemplary embodiments. In FIGS. 12A to 12D, substantially similar elements are indicated with the same reference numerals described above, and thus, repeated descriptions of the substantially similar elements will be omitted. While FIGS. 12A to 12D illustrate only the first sensing pattern SP1-1, it is noted that a second sensing pattern SP2 has substantially similar configuration as that of the first sensing pattern SP1-1, and thus, repeated description of the second sensing pattern SP 2 will be omitted.

Figure 12A:
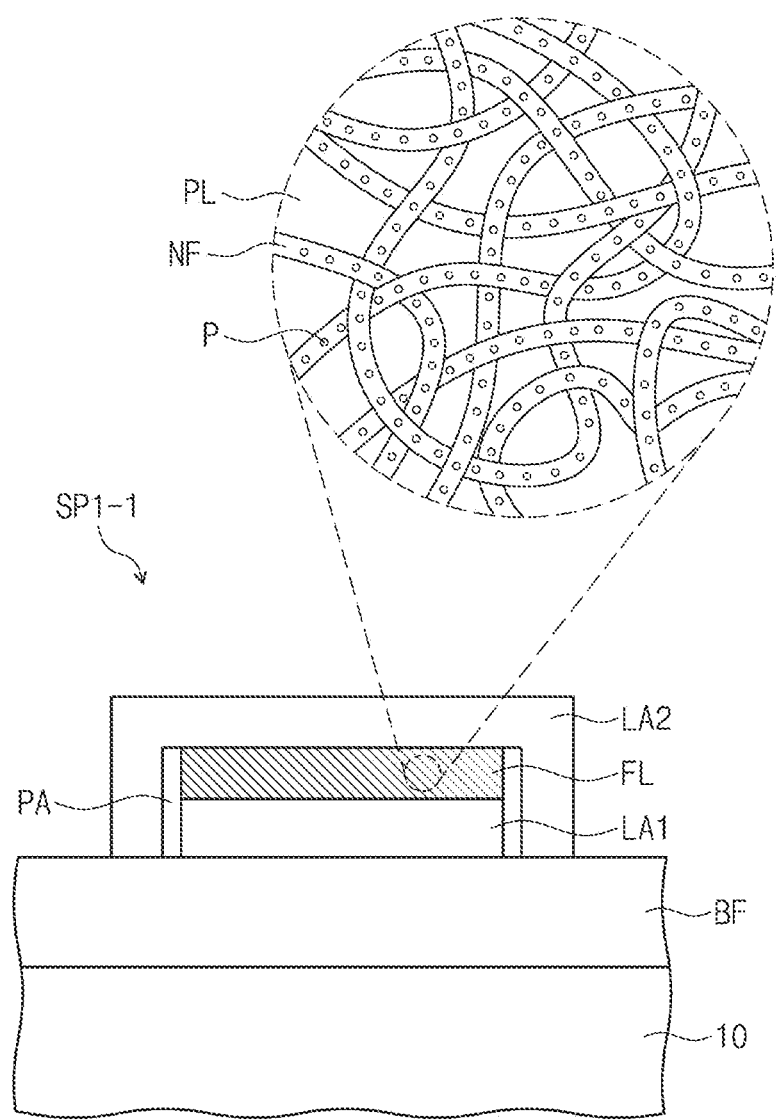
FIG. 12A is a cross-sectional view of a display device according to an exemplary embodiment.
Figure 12B:
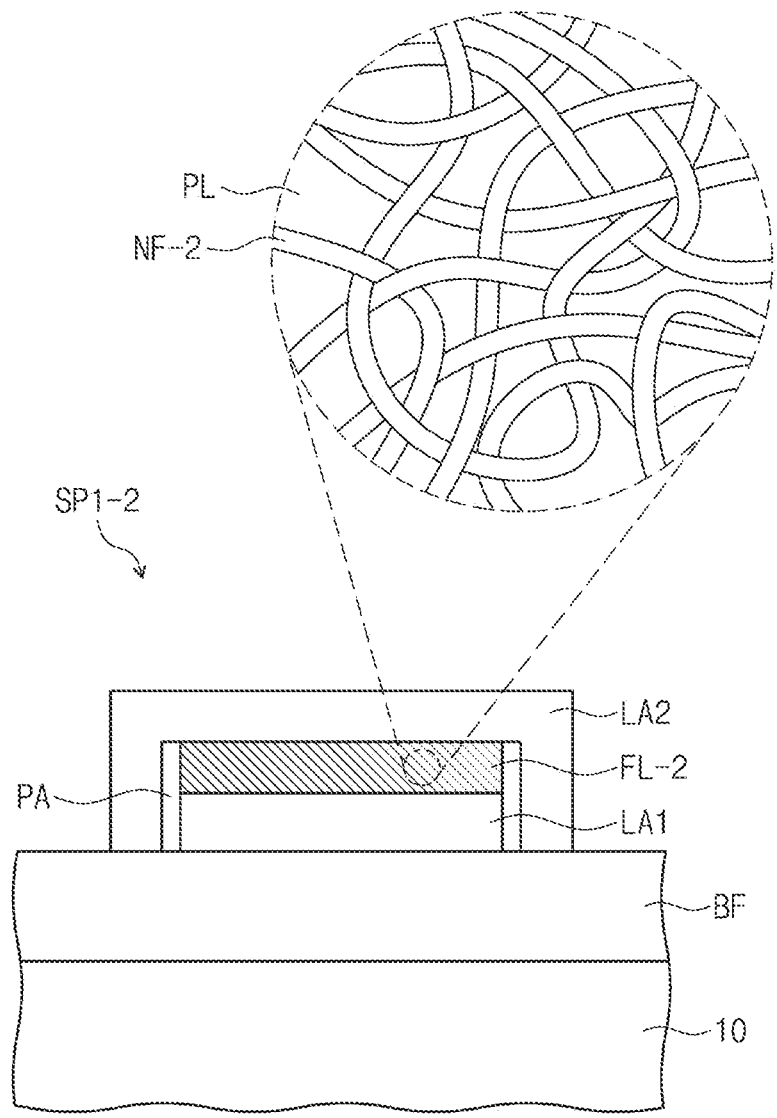
FIG. 12B is a cross-sectional view of a display device according to an exemplary embodiment.

Referring to FIG. 12A, the first sensing pattern SP1-1 according to an exemplary embodiment may further include a partition PA.

The partition PA may surround side surfaces of the fiber layer FL and the first conductive layer LA1. Specifically, the partition PA is disposed in a space defined by the side surfaces of the fiber layer FL, the side surfaces of the first conductive layer LA1, and the inner side surfaces of the second conductive layer LA2. The partition PA may separate the side surfaces of the fiber layer FL and the first conductive layer LA1 from the second conductive layer LA2. Moreover, the partition PA may be utilized as a frame for arranging the fiber layer FL during manufacturing process of the first sensor SP1. The partition PA will be described in more detail below with reference to FIGS. 17C to 17E.

Each of the nanofibers NF in the fiber layer FL may include the cavities P. The cavities P may more effectively relieve the folding stress applied to the conductive pattern. However, according to an exemplary embodiment illustrated in FIG. 12B, a fiber layer FL-2 in a first sensing pattern SP1-2 may include the partition PA and nanofibers NF-2, however, nanofibers NF-2 may not include cavities therein.

Figure 12C:
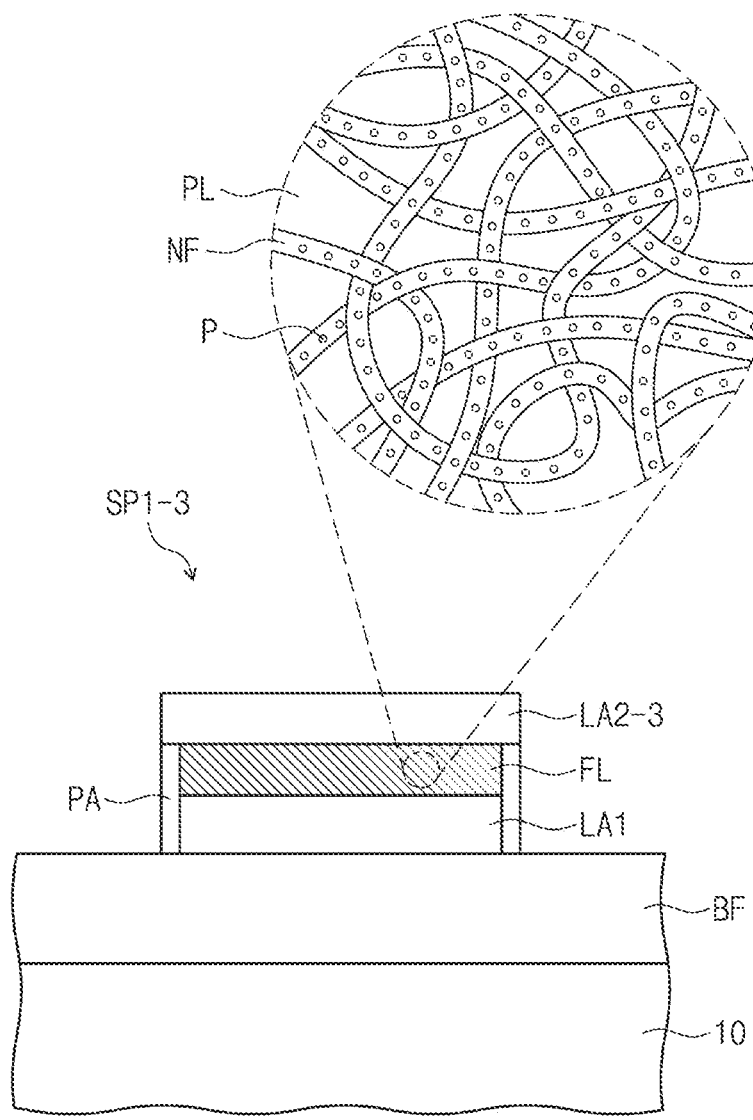
FIG. 12C is a cross-sectional view of a display device according to an exemplary embodiment.
Figure 12D:
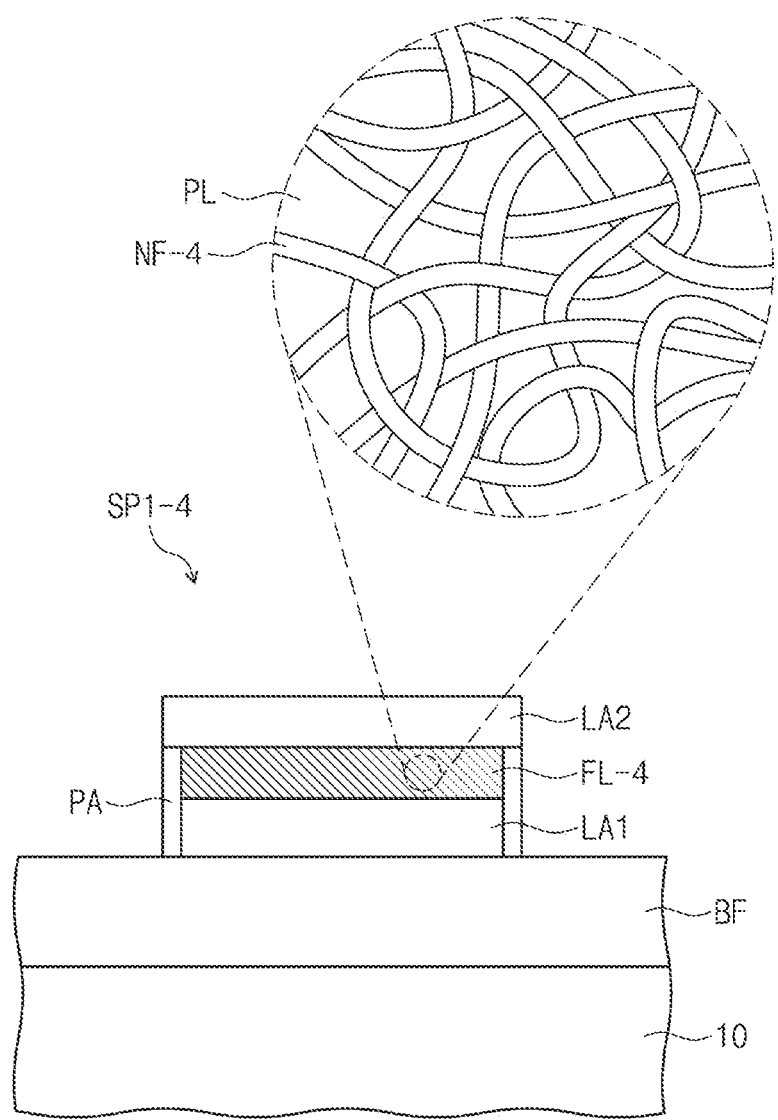
FIG. 12D is a cross-sectional view of a display device according to an exemplary embodiment.

Referring to FIG. 12C, the planar width of a second conductive layer LA2-3 of a first sensing pattern SP1-3 may be substantially similar to a distance between outer side surfaces of the partition PA. Accordingly, the second conductive layer LA2-3 may cover the top surface of the fiber layer FL, and the outer side surfaces of the partition PA may be exposed to the outside. In this case, since the width of the second conductive layer LA2-3 is less than the width of the second conductive layer LA2 illustrated in FIGS. 12A and 12B, the degree of integration of the conductive patterns per unit surface area of the touch member 20 may be improved.

Each of the nanofibers NF in the fiber layer FL according to an exemplary embodiment may include cavities P. The cavities may more effectively relieve the folding stress applied to the conductive pattern. However, according to an exemplary embodiment illustrated in FIG. 12D, a fiber layer FL-4 in a first sensing pattern SP1-4 may include the partition PA and nanofibers NF-4, however, nanofibers NF-4 may not include cavities therein.

Figure 13:
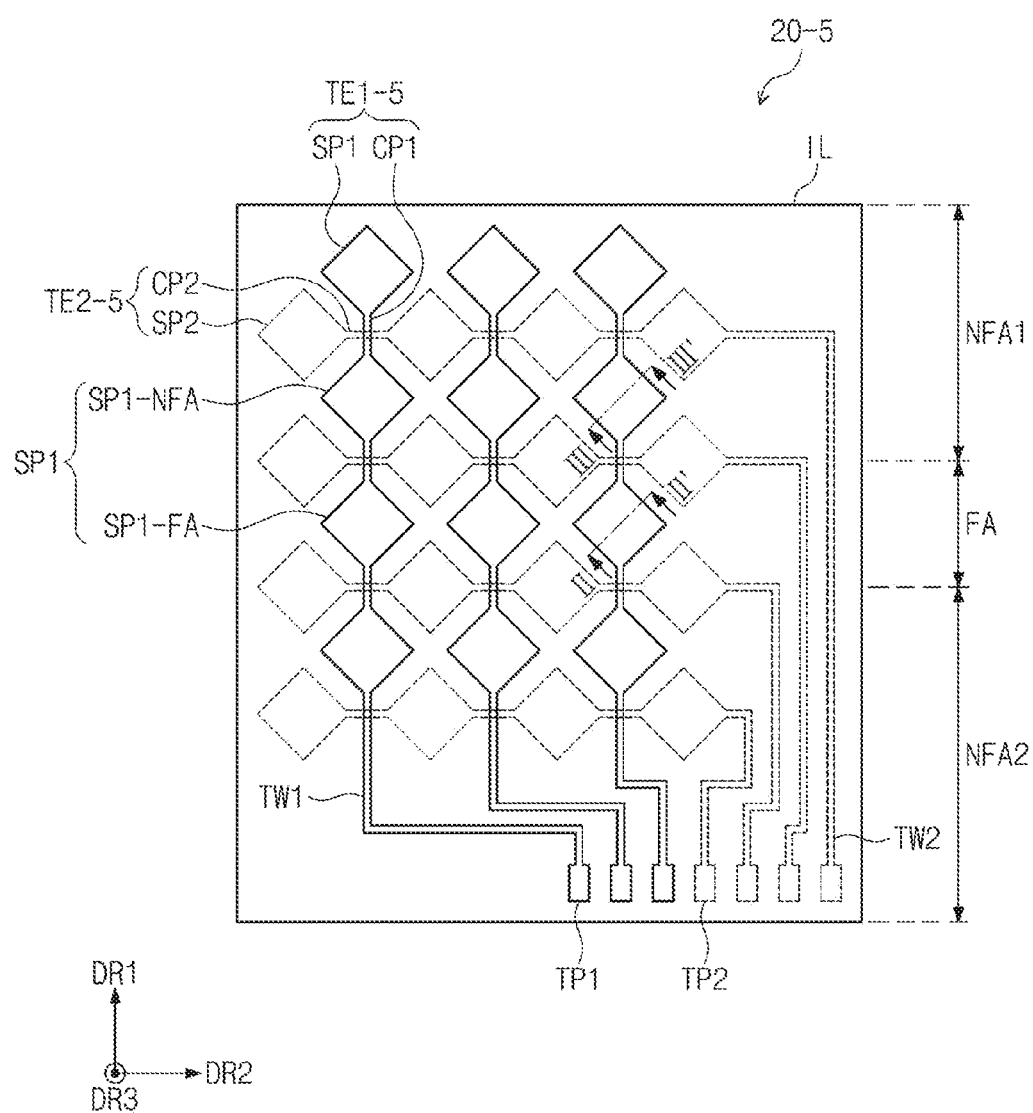
FIG. 13 is a plan view illustrating a display device according to an exemplary embodiment.
Figure 14:
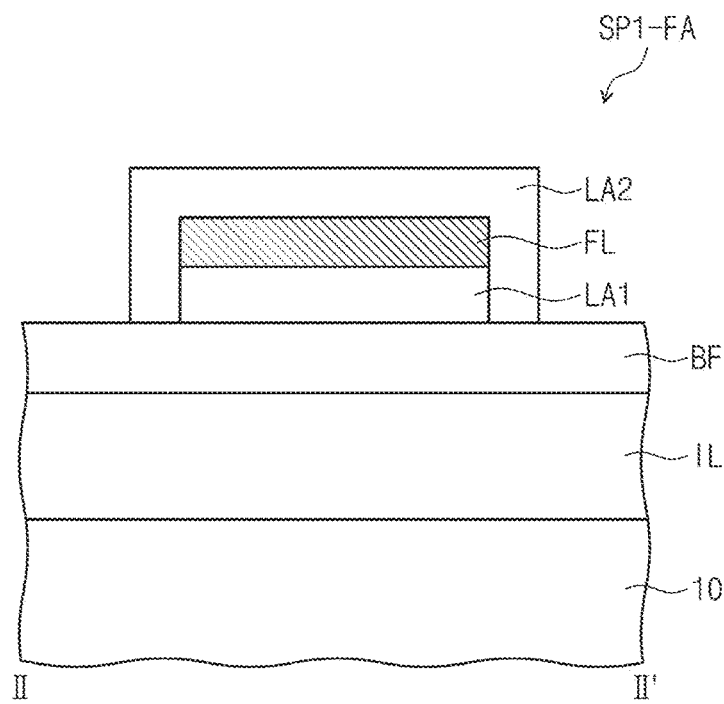
FIG. 14 is a cross-sectional view along line II-IF of the display device in FIG. 13.
Figure 15:
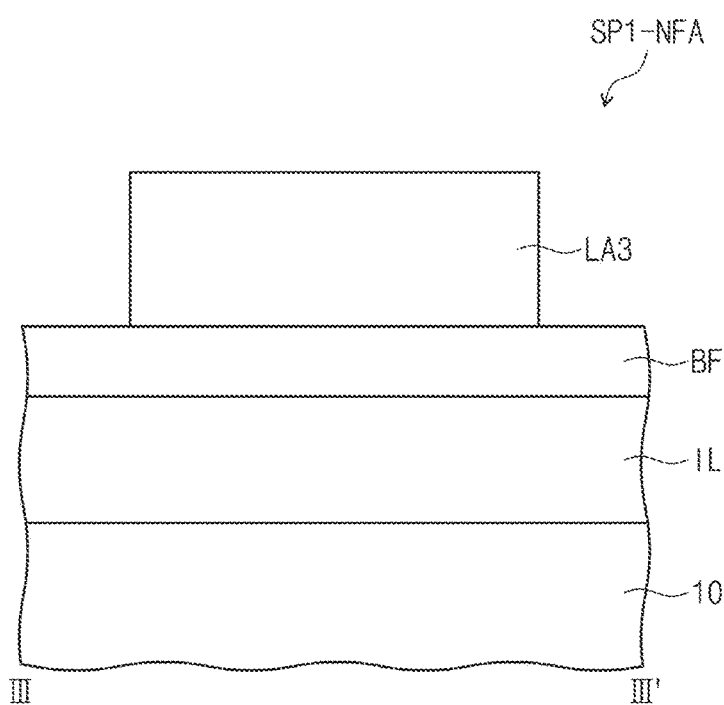
FIG. 15 is a cross-sectional view along line of the display device in FIG. 13.

FIG. 13 is a plan view illustrating a display device according to an exemplary embodiment, and FIG. 14 is a cross-sectional view along line II-IF of the display device in FIG. 13. FIG. 15 is a cross-sectional view along line of the display device in FIG. 13.

Referring to FIGS. 13 to 15, a touch member 20-5 according to an exemplary embodiment may further include an insulating layer IL. The touch member 20-5 may include conductive patterns disposed on different layers from each other.

A first touch electrode TE1-5, the first driving line TW1, and the first pad TP1 are disposed above the insulating layer IL, and a second touch electrode TE2-5, the second driving line TW2, and the second pad TP2 are disposed below the insulating layer IL. More particularly, the first touch electrode TE1-5, the first driving line TW1, and the first pad TP1 may be electrically insulated from the second touch electrode TE2-5, the second driving line TW2, and the second pad TP2 by the insulating layer IL.

According to an exemplary embodiment, a plurality of the first sensing patterns SP1 may be provided. The first sensing patterns SP1 may include a first conductive pattern SP1-FA and a second conductive pattern SP1-NFA, which are disposed on different portions of the touch member 20-5.

The first conductive pattern SP1-FA is disposed in the folding area FA. The first conductive pattern SP1-FA may include the fiber layer FL. The first conductive pattern SP1-FA may have a configuration substantially similar to that of the first sensing pattern SP1 illustrated in FIG. 10, and thus, repeated description thereof will be omitted.

The second conductive pattern SP1-NFA includes a third conductive layer LA3. The third conductive layer LA3 may be disposed on the top surface of the buffer layer BF. The third conductive layer LA3 may include a material having high electrical conductivity. The second conductive pattern SP1-NFA may have a structural shape that is cross-sectionally different from that of the first conductive pattern SP1-FA.

According to an exemplary embodiment, since the first conductive pattern SP1-FA including the fiber layer FL is disposed in the folding area FA, the folding stress applied to the folding area FA may be easily relieved.

FIGS. 16A to 16H are cross-sectional views illustrating a method for manufacturing a display device according to an exemplary embodiment. Specifically, FIGS. 16A to 16H illustrate a method for manufacturing the first sensing pattern SP1 illustrated in FIG. 10.

Figure 16A:
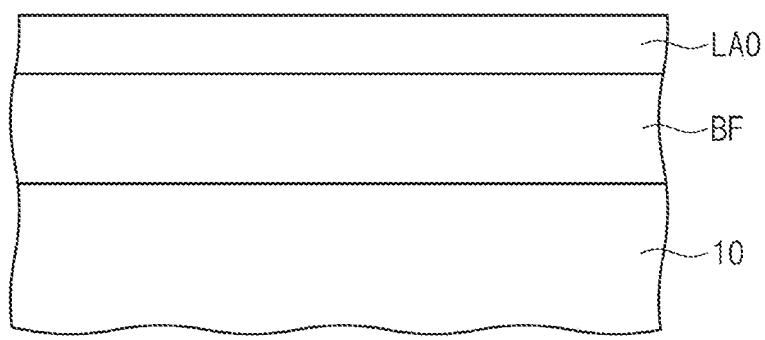
FIG. 16A, FIG. 16B, FIG. 16C, FIG. 16D, FIG. 16E, FIG. 16F, FIG. 16G, and FIG. 16H are cross-sectional views illustrating a method for manufacturing a display device according to an exemplary embodiment.

As illustrated in FIG. 16A, the buffer layer BF and a preliminary conductive layer LA0 are sequentially disposed on the base member 10. In an exemplary embodiment, the buffer layer BF may be omitted. The preliminary conductive layer LA0 may include an electrically conductive material. For example, the preliminary conductive layer LA0 may include aluminum (Al).

Figure 16B:
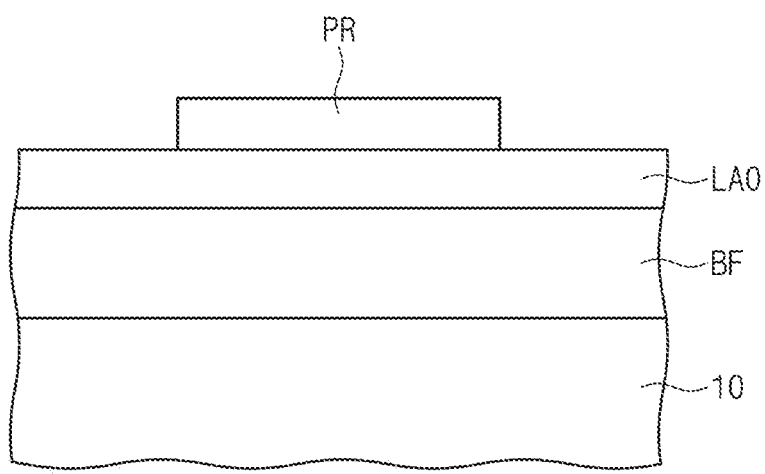

Referring to FIG. 16B, a mask pattern PR is disposed on the preliminary conductive layer LA0. The mask pattern PR may be a photoresist. The photoresist may include a photosensitive material. Accordingly, the mask pattern PR may be disposed on the preliminary conductive layer LA0 using a photolithography process. However, the mask pattern PR may be provided using various methods known in the art.

Figure 16C:
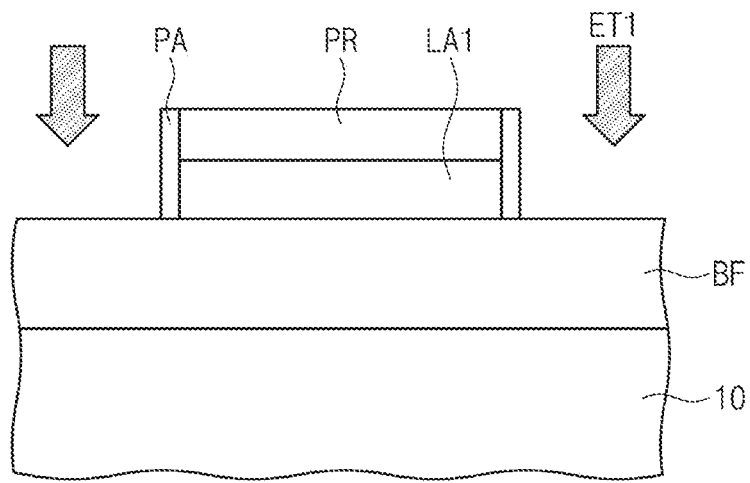

Referring to FIG. 16C, the preliminary conductive layer LA0 is etched to correspond to the mask pattern PR by providing a first etching gas ET1. The first conductive layer LA1 may be formed by patterning the preliminary conductive layer LA0 via an etching process.

The first conductive layer LA1 may react with the first etching gas ET1, such that the shape of the first conducive layer LA1 corresponds to each of the mask patterns PR. That is, the first conductive layer LA1 and the mask patterns PR may have the same shape in a plan view. For example, a portion of the first conductive layer LA1 that does not overlap with the mask patterns PR is removed by the first etching gas ET1, and the overlapping portion remains between the mask pattern PR and the buffer layer BF, and thus, the first conductive layer LA1 may have a predetermined pattern.

According to an exemplary embodiment, the first conductive layer LA1 may be formed by various etching process. For example, the first conductive layer LA1 may have a predetermined pattern from being etched with an etching fluid.

In the etching process, a portion etched from the buffer layer BF by the first etching gas ET1 may adhere to side surfaces of the first conductive layer LA1 and the mask pattern PR, thereby forming the partition PA. The partition PA may include silicon (Si). The partition PA may surround the side surfaces of the first conductive layer LA1 and the side surfaces of the mask pattern PR.

Figure 16D:
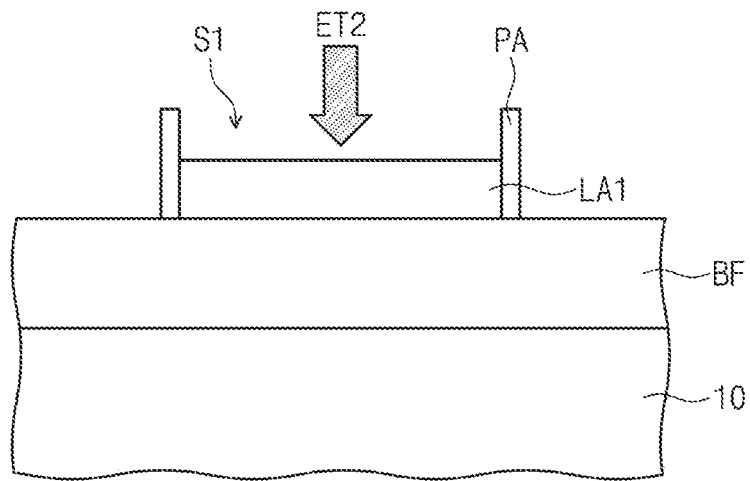

Referring to FIG. 16D, the mask pattern PR is removed by providing a second etching gas ET2. In this case, a first space S1 may be defined by the top surface of the first conductive layer LA1, which is exposed from the removal of the mask pattern PR, and the inner side surfaces of the partition PA.

According to an exemplary embodiment, the mask pattern PR may be removed by various etching methods. For example, the mask pattern PR may be removed by an etching fluid.

Figure 16E:
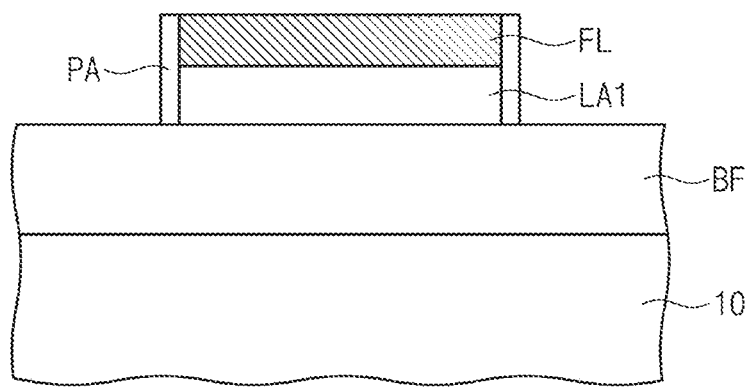
Figure 16F:
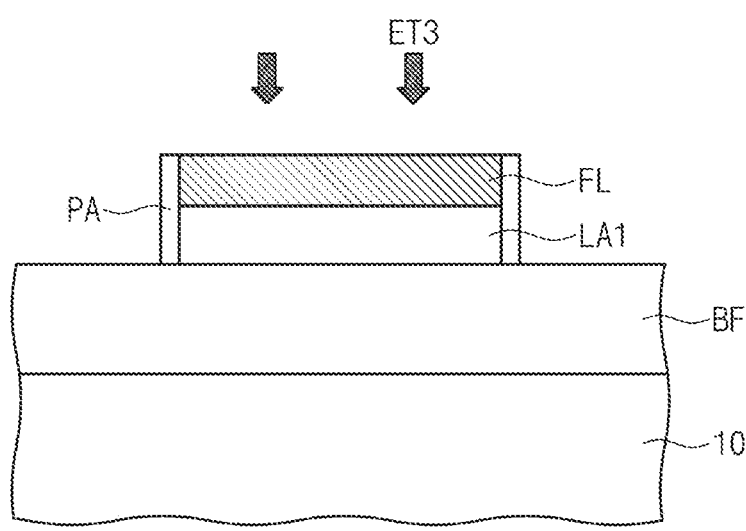

Hereinafter, as illustrated in FIGS. 16E and 16F, the fiber layer FL is disposed in the first space S1. In this manner, the inner side surfaces of the partition PA may function as a frame for forming the fiber layer FL. The fiber layer FL may be more flexible than the first conductive layer LA1. Accordingly, the fiber layer FL may relive the folding stress applied to the conductive pattern.

The fiber layer FL may include nanofibers (not shown). The nanofibers may be formed using an electrospinning method. However, the nanofibers may be formed using various methods.

Afterwards, cavities (not shown) may be formed in each of the nanofibers (not shown) included in the fiber layer FL, by providing a third etching gas ET3 to the fiber layer FL. For example, each of the nanofibers may include nanoparticles, and the nanoparticles may be removed by the third etching gas ET3, thereby forming the cavities in each of the nanofibers. The third etching gas ET3 may include hydrogen fluoride (HF). However, the cavities may be formed using various types of processes.

Moreover, according to an exemplary embodiment, a filler (not shown) may be charged between the nanofibers. The filler may fix and protect the nanofibers.

Figure 16G:
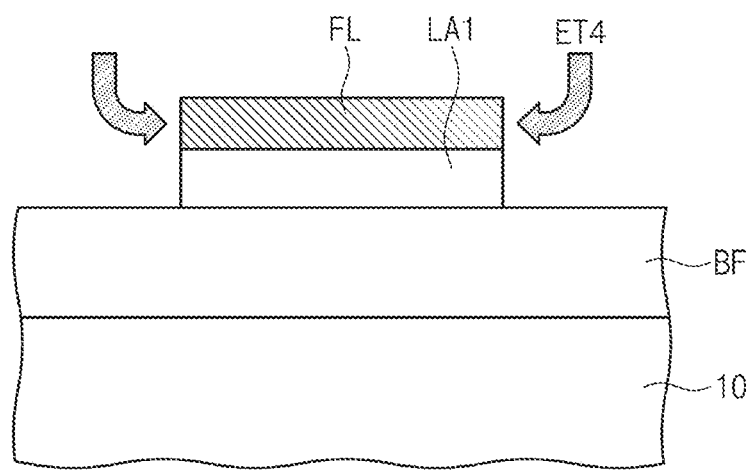

Referring to FIG. 16G, the partition PA is removed by providing a fourth etching gas ET4. According to an exemplary embodiment, the partition PA may be removed by various etching process. For example the partition PA may be removed by an etching fluid. In an exemplary embodiment, the step of removing the partition may be omitted.

Figure 16H:
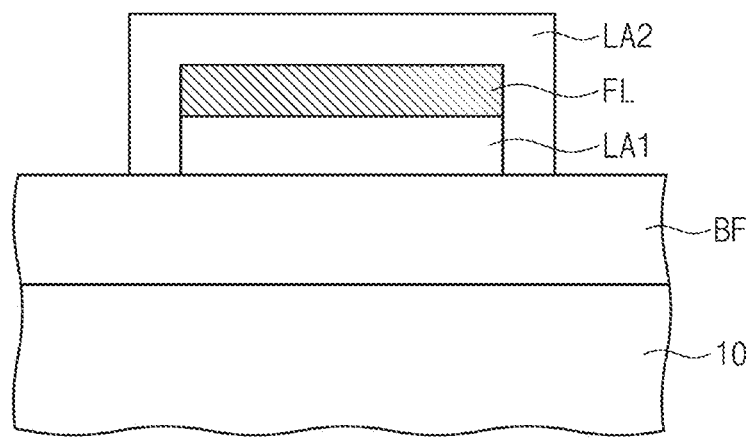

Referring to FIG. 16H, the second conductive layer LA2 is disposed on the first conductive layer LA1 and the fiber layer FL. The second conductive layer LA2 may entirely cover the fiber layer FL. The second conductive layer LA2 may include the same material as the first conductive layer.

The planar width of the second conductive layer LA2 may be greater than the planar width of the fiber layer FL. Accordingly, the second conductive layer LA2 may surround the side surfaces of the fiber layer FL and the side surfaces of the first conductive layer LA1.

The first and second sensing patterns SP1 and SP2 manufactured according to the above operations may be applied to the display device 100 illustrated in FIG. 1. As described above, a display device manufactured according to an exemplary embodiment may easily relieve the folding stress applied to its folding area FA.

According to an exemplary embodiment, a display device may have enhanced folding properties while maintaining the shape of a conductive pattern. The conductive pattern includes a fiber layer, which may reduce the folding stress applied to a touch member. Accordingly, the display device may be strengthened against folding and have enhanced reliability.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
a display panel configured to display an image and having a folding area by which the display panel is configured to be folded along a folding axis; and
a touch member disposed on the display panel and configured to detect an external touch signal, the touch member comprising a plurality of first conductive patterns disposed to overlap the folding area,
wherein each of the first conductive patterns comprises a fiber layer comprising a plurality of nanofibers, the nanofibers comprising a plurality of cavities.

2. The display device of claim 1, wherein each of the first conductive patterns further comprises:
a first conductive layer disposed on the display panel; and
a second conductive layer disposed on the first conductive layer,
wherein the fiber layer is disposed between the first conductive layer and the second conductive layer.

3. The display device of claim 2, wherein:
a planar width of the second conductive layer is greater than a planar width of the fiber layer; and
the second conductive layer covers the fiber layer and side surfaces of the first conductive layer.

4. The display device of claim 2, wherein each of the first conductive patterns further comprises a partition surrounding side surfaces of the first conductive layer and the fiber layer.

5. The display device of claim 4, wherein:
a planar width of the second conductive layer is greater than a planar width of the fiber layer; and
the second conductive layer covers the fiber layer and outer side surfaces of the partition.

6. The display device of claim 4, wherein the partition comprises at least one of silicon oxide, silicon nitride, and silicon oxynitride.

7. The display device of claim 2, wherein:
the touch member further comprises a plurality of second conductive patterns disposed to overlap a non-folding area adjacent to the folding area;
each of the second conductive patterns comprises a third conductive layer; and
a cross-sectional shape of each of the second conductive patterns is different from a cross-sectional shape of each of the first conductive patterns.

8. The display device of claim 1, wherein the fiber layer further comprises a filler comprising a polymer material charged between the nanofibers.

9. The display device of claim 1, wherein the nanofibers comprise an organic material.

10. The display device of claim 1, wherein the nanofibers comprise a carbon nanotube.

11. A display device comprising:
a display panel configured to display an image and having a folding area by which the display panel is configured to be folded along a folding axis; and
a touch member disposed on the display panel and configured to detect an external touch signal, the touch member comprising a plurality of conductive patterns disposed to overlap the folding area,
wherein each of the conductive patterns comprises:
a first conductive layer disposed on the display panel;
a second conductive layer disposed on the first conductive layer;
a fiber layer disposed between the first conductive layer and the second conductive layer and comprising a plurality of nanofibers; and
a partition surrounding side surfaces of the first conductive layer and the fiber layer.

12. The display device of claim 11, wherein each of the nanofibers comprises a plurality of cavities.

13. The display device of claim 11, wherein:
a planar width of the second conductive layer is greater than a planar width of the fiber layer; and
the second conductive layer covers outer side surfaces of the partition and the fiber layer.

14. The display device of claim 11, wherein the partition comprises at least one of silicon oxide, silicon nitride, and silicon oxynitride.

15. A method for manufacturing a display device, the method comprising:
- forming a first conductive pattern on a folding area of a display panel, by which the display panel is configured to be folded along a folding axis,
- wherein forming the first conductive pattern comprises:
  - forming a first conductive layer;
  - forming a fiber layer comprising a plurality of nanofibers on the first conductive layer; and
  - forming a second conductive layer on the fiber layer.

16. The method of claim 15, wherein forming the fiber layer comprises:
- forming the nanofibers comprising nanoparticles by an electrospinning method;
- forming a plurality of cavities in each of the nanofibers by etching the nanoparticles in the nanofibers; and
- charging a filler between the nanofibers.

17. The method of claim 15, wherein a planar width of the second conductive layer is formed to be greater than a planar width of the fiber layer.

18. The method of claim 15, wherein forming the first conductive pattern comprises forming a partition surrounding side surfaces of the first conductive layer and the fiber layer.

19. The method of claim 18, wherein:
forming the first conductive layer further comprises:
- forming a preliminary conductive layer on a base member;
- forming a mask pattern on the preliminary conductive layer; and
- patterning the preliminary conductive layer, such that the preliminary conductive layer corresponds to the mask pattern by etching the preliminary conductive layer;

forming the first conductive pattern further comprises:
- forming the partition surrounding the side surfaces of the first conductive layer and the side surfaces of the mask pattern;
- removing the mask pattern; and
- forming the fiber layer in a first space formed by the partition and a top surface of the first conductive layer.

20. The method of claim 19, wherein forming the first conductive pattern further comprises removing the partition.

* * * * *